(12) United States Patent
Kim

(10) Patent No.: US 6,509,202 B1
(45) Date of Patent: Jan. 21, 2003

(54) METHOD AND SYSTEM FOR QUALIFYING AN ONO LAYER IN A SEMICONDUCTOR DEVICE

(75) Inventor: Hyeon-Seag Kim, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/875,073

(22) Filed: Jun. 5, 2001

(51) Int. Cl.[7] .................... H01L 21/66; H01L 21/00; G01R 31/26
(52) U.S. Cl. ............................ 438/17; 438/10
(58) Field of Search .................. 438/17–18, 14–16, 438/10–13, 800

(56) References Cited

PUBLICATIONS

Japanese Abstract JP 10214966A Aug. 11, 1998. "Method for managing a process".*

\* cited by examiner

Primary Examiner—Olik Chaudhuri
Assistant Examiner—Craig Thompson
(74) Attorney, Agent, or Firm—Sawyer Law Group LLP

(57) ABSTRACT

A method and system for qualifying an oxide-nitride-oxide (ONO) layer including a first oxide layer, a nitride layer and a control oxide layer in a semiconductor device is disclosed. The method and system include determining the lifetime of the ONO layer using the activation energy of the ONO layer and the field acceleration factor of the ONO layer. The activation energy and field acceleration factor of the ONO layer are determined by testing a plurality of ONO layers, some of which have a particular nitride layer thickness and varying control oxide layer thicknesses and others which have a particular control oxide layer thicknesses and varying nitride layer thicknesses. The plurality of ONO layers is tested using a variety of applied voltages to obtain lifetimes for the plurality of ONO layers. Based on these lifetimes and voltages, the activation energy and field acceleration factor for the ONO layer can be obtained.

7 Claims, 6 Drawing Sheets

METHOD AND SYSTEM FOR QUALIFYING AN ONO LAYER IN A SEMICONDUCTOR DEVICE

FIELD OF THE INVENTION

The present invention relates to semiconductor devices, and more particularly to a method and system for qualifying an ONO layer in a semiconductor device.

BACKGROUND OF THE INVENTION

FIG. 1 depicts a portion of a conventional semiconductor device 10, such as a Flash memory device. The conventional semiconductor 10 utilizing an oxide-nitride-oxide ("ONO") layer 13 formed on a semiconductor substrate 12. The ONO layer 13 includes two oxide layers separated by a nitride layer 16. The first oxide layer, which is closest to the substrate 12 is a tunnel oxide layer 14. The upper oxide layer is a control oxide layer 18. The thinned portion of the control oxide layer 18 corresponds to a bitline 20 that runs perpendicular to the plane of FIG. 1. The nitride layer 14 acts as a charge storage layer, or a floating gate. Thus, charges can tunnel through the tunnel oxide layer 14 and be trapped on the nitride layer 14. As a result, the threshold voltage of a device utilizing the ONO layer 13 is changed. In order to alter the threshold voltage, a voltage is typically applied to the control oxide layer 18.

Typically, devices made using the ONO layer 13 are desired to be qualified, or investigated to determine that their properties meet certain specifications. In particular, it is desirable to ensure that when the ONO layer 13 is included in a device, such as a flash memory device, the ONO layer 13 will have a particular lifetime. It is, therefore, desirable to qualify the ONO layer 13.

One property of the ONO layer 13 desired to be determined during qualification is the lifetime of the ONO layer 13. Predicting the lifetime of the ONO layer 13, particularly in structures such as the bitline 20, is difficult. The ONO layer 13 is a multiplayer. As such, different layers within the ONO layer, such as the tunnel oxide 14, the nitride 16 and the control oxide 18, may have different properties. These layers 14, 16 and 18 within the ONO layer 13 therefore have different lifetimes. As a result, the lifetime of the ONO layer 13 could vary. Consequently, reliably predicting the lifetime of the ONO layer 13 is difficult.

Accordingly, what is needed is a system and method for qualifying an ONO layer. The present invention addresses such a need.

SUMMARY OF THE INVENTION

A method and system for qualifying an oxide-nitride-oxide (ONO) layer including a first oxide layer, a nitride layer and a control oxide layer in a semiconductor device is disclosed. The method and system comprise determining a first plurality of lifetimes for the ONO layer. The first plurality of lifetimes is determined utilizing a first plurality of applied voltages at a first plurality of temperatures for each of a first plurality of ONO layers having a particular nitride layer thickness and a plurality of control oxide layer thicknesses. The method and system also comprise determining a second plurality of lifetimes for the ONO layer. The second plurality of lifetimes are determined utilizing a second plurality of applied voltages at a second plurality of temperatures for each of a second plurality of ONO layers having a particular control oxide layer thickness and a plurality of nitride layer thicknesses. The method and system also comprise determining a field acceleration factor for the ONO layer based on the first plurality of lifetimes, the second plurality of lifetimes, the first plurality of applied voltages and the second plurality of applied voltages. In addition, the method and system comprise determining an activation energy for the ONO layer based on the first plurality of lifetimes, the second plurality of lifetimes, the first plurality of temperatures and the second plurality of temperatures. The method and system also comprise determining a lifetime for the ONO layer based upon the field acceleration factor and the activation energy for the ONO layer.

According to the system and method disclosed herein, the present invention provides a method for qualifying an ONO layer, as well as selecting thicknesses of the control oxide and nitride layer that can improve performance of the ONO layer.

DETAILED DESCRIPTION OF THE INVENTION

The present invention relates to an improvement in characterization of semiconductor devices. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

A method and system for qualifying an oxide-nitride-oxide (ONO) layer including a first oxide layer, a nitride layer and a control oxide layer in a semiconductor device is disclosed. The method and system comprise determining a first plurality of lifetimes for the ONO layer. The first plurality of lifetimes is determined utilizing a first plurality of applied voltages at a first plurality of temperatures for each of a first plurality of ONO layers having a particular nitride layer thickness and a plurality of control oxide layer thicknesses. The method and system also comprise determining a second plurality of lifetimes for the ONO layer. The second plurality of lifetimes are determined utilizing a second plurality of applied voltages at a second plurality of temperatures for each of a second plurality of ONO layers having a particular control oxide layer thickness and a plurality of nitride layer thicknesses. The method and system also comprise determining a field acceleration factor for the ONO layer based on the first plurality of lifetimes, the second plurality of lifetimes, the first plurality of applied voltages and the second plurality of applied voltages. In addition, the method and system comprise determining an activation energy for the ONO layer based on the first plurality of lifetimes, the second plurality of lifetimes, the first plurality of temperatures and the second plurality of temperatures. The method and system also comprise determining a lifetime for the ONO layer based upon the field acceleration factor and the activation energy for the ONO layer.

The present invention will be described in terms of a particular method having certain steps. Furthermore, for clarity, certain steps may be omitted. However, the present invention is consistent with a method having additional or different steps. In addition, the present invention is described in the context of a particular device. However, one of ordinary skill in the art will readily recognize that the present invention can be used with other devices having an ONO layer.

Figure 1:
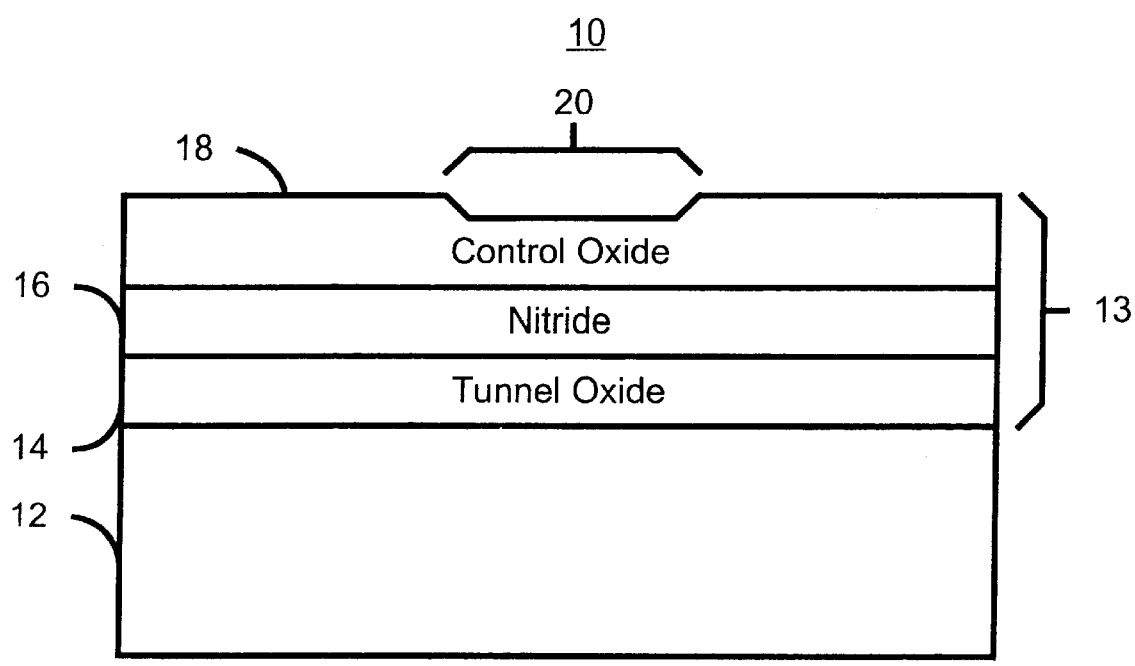
FIG. 1 is a diagram of a conventional ONO layer.
Figure 2:
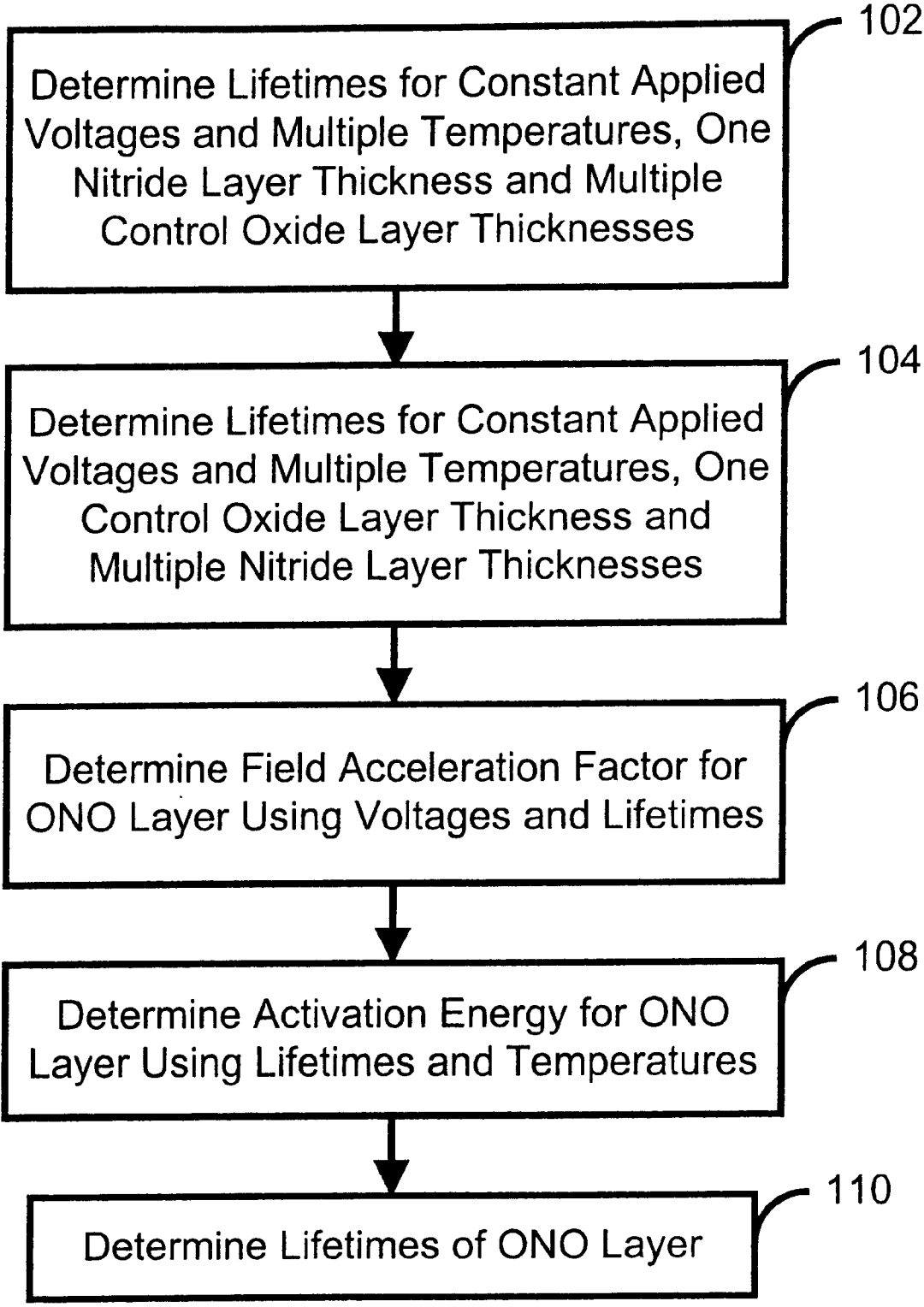
FIG. 2 is a high-level flow chart depicting one embodiment of a method in accordance with the present invention for qualifying an ONO layer.

To more particularly illustrate the method and system in accordance with the present invention, refer now to FIG. 2, depicting a high-level flow chart of one embodiment of a method 100 for qualifying an ONO layer in accordance with the present invention. The ONO layer includes a first, tunnel oxide layer, a nitride layer and a second, control oxide layer. Lifetimes for first set of ONO layers are determined using a plurality of applied voltages and at a plurality of temperatures, via step 102. Each of the first set of ONO layers has a particular thickness for the nitride layer and multiple thicknesses for the control oxide layers. In a preferred embodiment, at least three ONO layers having the same nitride thickness and (three) different control oxide thicknesses are tested for each applied voltage and each temperature. In a preferred embodiment, at each temperature each ONO layer is tested with multiple applied voltages. For a particular applied voltage, the constant applied voltage is provided until the ONO layer fails. For example, an ONO layer having a first control oxide thickness would be tested until failure at multiple applied voltages for a first temperature. This test would be repeated, possibly using different applied voltages, at other temperatures. Other ONO layers having different control oxide thicknesses would then be tested in a similar manner. Thus, the lifetimes at different temperatures for different applied voltages and different control oxide layer thicknesses would be determined in step 102. The lifetime determined in step 102 is the time taken for a certain percentage of the ONO layers tested at the constant voltage to fail. In a preferred embodiment, the percentage is fifty percent of the ONO layers.

The lifetimes for a second set of ONO layers are determined using a plurality of applied voltages and at a plurality of temperatures, via step 104. Each of the second set of ONO layers has a particular thickness for the control oxide layers and multiple thicknesses for the nitride layers are utilized in step 102. In a preferred embodiment, at least three ONO layers having the same control oxide layer thickness and (three) different nitride layer thicknesses are tested for each applied voltage and each temperature. In a preferred embodiment, at each temperature each ONO layer is tested with multiple applied voltages. For a particular applied voltage, the constant applied voltage is provided until the ONO layer fails. For example, an ONO layer having a first control oxide thickness would be tested until failure at multiple applied voltages for a first temperature. This test would be repeated, possibly using different applied voltages, at other temperatures. Other ONO layers having different control oxide thicknesses would then be tested in a similar manner. The lifetime determined in step 104 is the time taken for a certain percentage of the ONO layers tested at the constant voltage to fail when the constant voltage is applied. In a preferred embodiment, the percentage is fifty percent of the ONO layers. In a preferred embodiment, the same applied voltages are used in step 104 as are used in step 102, but this is not required.

The field acceleration factor for the ONO layer is determined, via step 106. The field acceleration factor is determined in step 106 based on the lifetimes determined both in step 102 and step 104 and the applied voltages used in step 102 and 104. In addition, the expected lifetime of the ONO layer is also preferably used. The expected lifetime of the ONO layer for differing control oxide layer thicknesses, $t_{exp}$, is given by:

$$t_{exp} = A10^{(BEox)} \qquad (1)$$

where:

A=constant $B_{ox}$=field acceleration factor for the oxide layer $E_{ox}$=applied field the control oxide layer In a preferred embodiment, the field acceleration factor for the ONO layer is determined by determining a field acceleration factor for the control oxide layer and by determining a field acceleration factor for the nitride layer. The field acceleration factor for the control oxide layer can be determined using the information obtained in step 102. In particular, the field acceleration factor can be determined from the slope of the lifetime versus the applied voltages. The field acceleration factor for the nitride layer can be determined in a similar manner using the lifetimes and applied voltages from step 104. In addition, the constant, A, can also be determined once the field acceleration factor and activation energy for the control oxide and nitride layers are determined. The field acceleration factor for the ONO layer is preferably determined based on the reciprocals of the field acceleration factors for the nitride and control oxide layers.

An activation energy for the ONO layer is determined, via 108. The activation energy determined in step 108 based on the lifetimes determined in step 102 and step 104. In a preferred embodiment, the activation energy of the ONO layer is determined using the activation energy of the control oxide layer and the activation energy of the nitride layer. The activation energy of the control oxide layer is determined using the lifetimes obtained and the temperatures used in step 102. Similarly, the activation energy of the nitride layer is determined using the lifetimes obtained and the temperatures used in step 104. The activation energy is the slope of the curve of the lifetime versus the temperature.

Once the activation energy and field acceleration factor for the ONO layer are obtained, the lifetime for the ONO layer is determined based upon the field acceleration factor and the activation energy for the ONO layer, via step 110. In a preferred embodiment, the lifetime of the ONO layer, $T_{ONO}$, is given by:

$$T_{ONO} = t_{ono}[\exp\{(E_a/k)(T_{op}+273)^{-1}-(T_{test}+273)^{-1})\}] \qquad (2)$$

where:

$t_{ono}$=expected lifetime of ONO layer=$Ae^{(B_{ono}E)}$

E=applied field for the ONO layer $V_{max}/\chi_{eff}$ $V_{max}$=Maximum applied voltage $\chi_{\mathit{eff}}$=effective thickness of the ONO layer=$\epsilon_{ox}$/$\epsilon_{nitride}\chi_{control\ ox}$+1/$\chi_{nitride}$+1/$\chi_{tunnel\ ox}$ $\chi_{controlox}$=effective thickness of the control oxide layer $\chi$nitride=effective thickness of nitride layer $\chi_{tunnel\ ox}$=effective thickness of the remaining oxide layer $\epsilon_{ox}$=dielectric constant of control oxide layer $\epsilon_{nitride}$=dielectric constant of nitride layer $B_{ONO}$=field acceleration factor for the ONO layer $E_a$=activation energy of the ONO layer k=Boltzman's constant $T_{op}$=Operating temperature of ONO layer (in degrees C.)

$T_{test}$=Test temperature (usually higher than operating temp) (in degrees C.)

The maximum applied voltage, $V_{max}$, can be taken from the applied voltage applied during the tests in step 102 or 104. The effective thicknesses are used to account for thinning of portions of the ONO layer. The effective thicknesses of the control oxide, nitride and tunnel oxide layers can be determined based upon the thicknesses selected and provided during preparation of the ONO layers. The relationship between the ONO layer's effective thickness and the effective thicknesses of the control oxide, nitride and tunnel oxide layers is derived from a relationship between the capacitance of the ONO layer (assuming a dielectric constant equal to that of oxide for the entire ONO layer) and the individual capacitances of the control oxide, nitride and tunnel oxide layers. The activation energy and field acceleration factor for the ONO layers were determined in step 106.

Thus, the lifetime of the ONO layer can be predicted using the method 100. As a result, the ONO layer can be qualified. Furthermore, because a constant applied voltage is used in the tests performed in steps 102 and 104, the resulting calculation of the lifetime of the ONO layer is more accurate. In addition, because several different control oxide and nitride layer thicknesses are used, the relationship between lifetime of the ONO layer versus control oxide and nitride layer thicknesses can be determined. As a result, control oxide layer and nitride layer thicknesses can be selected so that the ONO layer lifetime is improved.

Figure 3A:
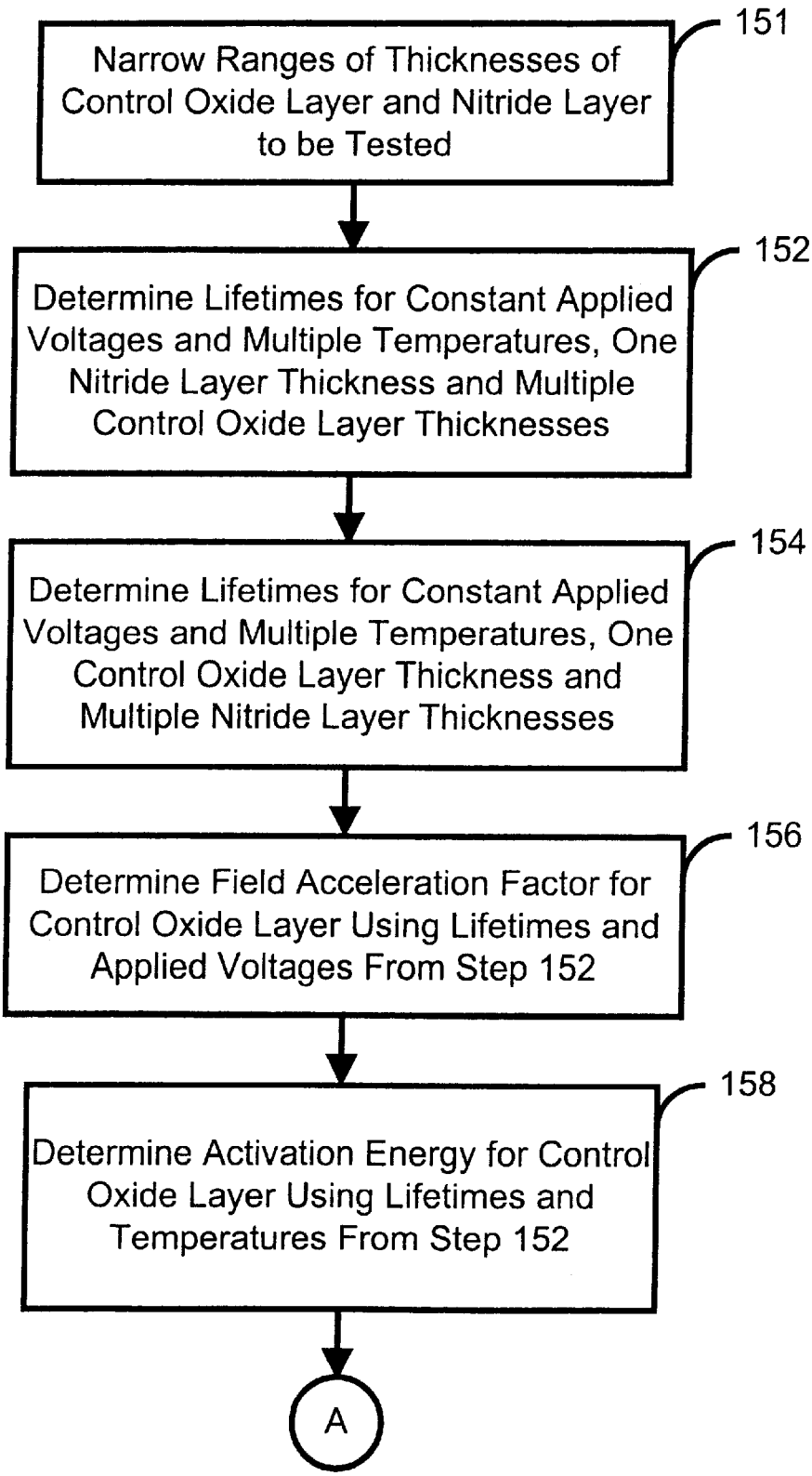
FIG. 3A and 3B depict a more detailed flow chart depicting one embodiment of a method in accordance with the present invention for qualifying an ONO layer.
Figure 3B:
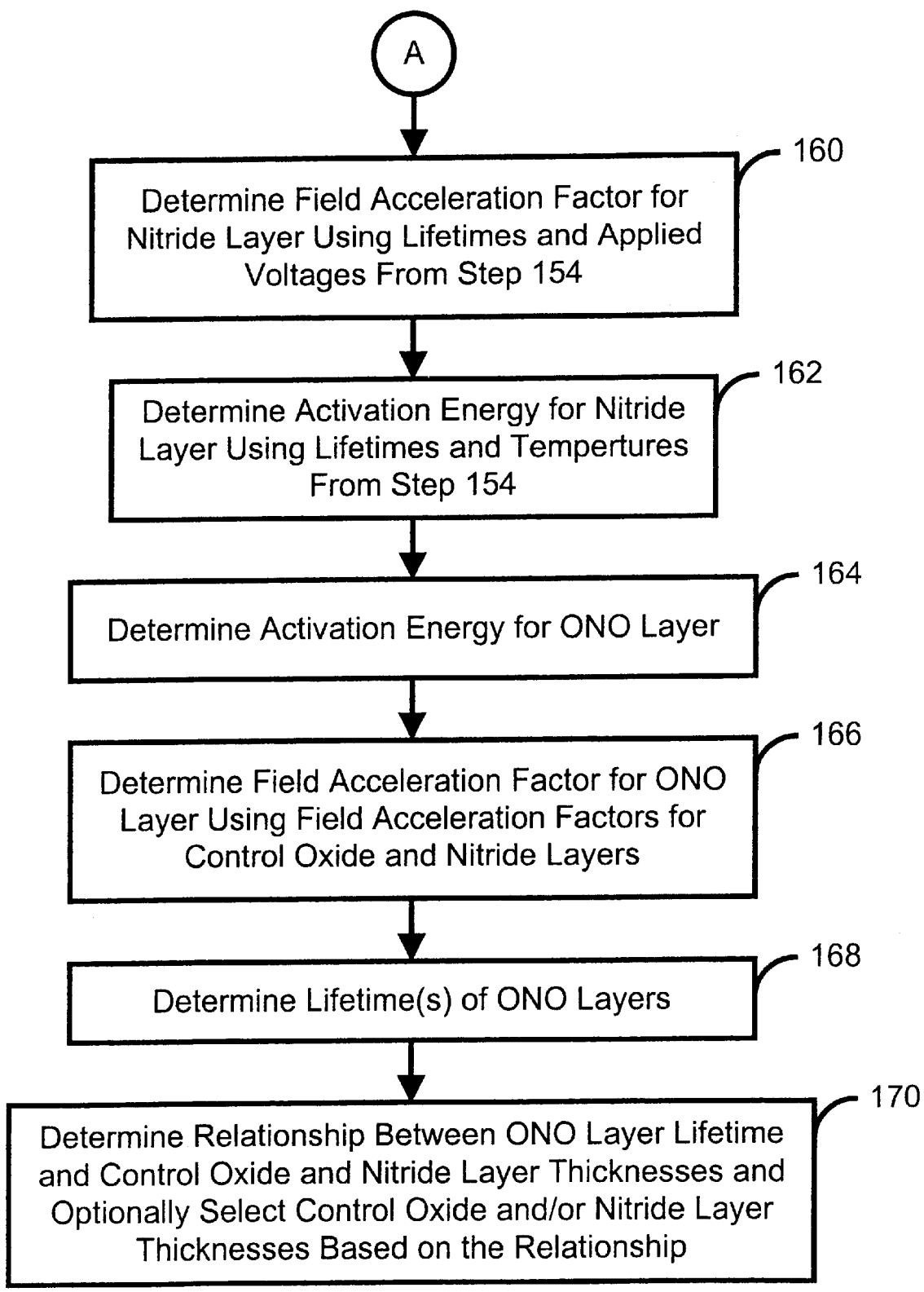

FIGS. 3A and 3B depict a more detailed flow chart depicting one embodiment of a method 150 in accordance with the present invention for qualifying an ONO layer. The ONO layer includes a first, tunnel oxide layer, a nitride layer and a second, control oxide layer. In a preferred embodiment, the method 150 commences by narrowing the control oxide layer thicknesses and the nitride layer thicknesses to be tested, via step 151. Step 151 preferably narrows the thicknesses tested to a range of control oxide layer thicknesses and a range of nitride layer thicknesses that will result in longer ONO lifetimes. In a preferred embodiment, step 151 is performed through the use of a voltage ramp dielectric breakdown test. The voltage ramp dielectric breakdown test applies an increasing voltage to the ONO layer. Preferably, the voltage increases in steps, rather than at a constant rate. The voltage is increased until the ONO layer undergoes dielectric breakdown. The voltage at which the ONO layer breaks down is known as the breakdown voltage.

Once the breakdown voltages are obtained, they can be converted into lifetimes as follows. For the control oxide, the following relationship holds true:

$$V_{BD}(ox)(50\%)/T_{ox\ eff}=V_{BD}(ox)/T_{ox\ eff}(50\%) \quad (3)$$

where $V_{BD}(ox)(50\%)$=breakdown voltage at a cumulative failure rate of 50%

$V_{BD}(ox)$=actual breakdown voltage $T_{ox\ eff}(50\%)$=median thickness of control oxide layer $T_{ox\ eff}$=effective control oxide layer thickness=$V_{BD}(ox)(50\%)T_{ox\ eff}(50\%)/V_{BD}(ox)$ Thus, using the actual breakdown voltages obtained using the voltage ramp dielectric breakdown, the effective thickness for the control oxide layer can be calculated. The lifetime can also be determined. Thus, the lifetime versus the effective control oxide layer thickness can be approximated. The range of control oxide thicknesses for testing can be selected based on the relationship between the effective control oxide layer thickness and the lifetime. In a preferred embodiment, the range of control oxide thicknesses can be chosen to be around an effective thickness that results in a higher lifetime. The lifetime versus effective nitride layer thickness and the range of nitride layer thicknesses can also be determined in a similar manner. Note that the voltage ramp dielectric test is fast, though less accurate than use of the constant voltage described above in the method 100 and below in the remaining portion of the method 150. Thus, the voltage ramp dielectric test is used to rapidly narrow the thicknesses of the control oxide layer and the nitride layer. The remainder of the method 150 then more accurately determines the lifetimes of the ONO layer and the desired thicknesses of the control oxide and nitride layers.

The lifetimes for ONO layers having a single nitride layer thickness and multiple control oxide layer thicknesses are obtained using multiple constant applied voltages at multiple temperatures, via step 152. For a particular temperature, a particular (constant) applied voltage and particular ONO layer, the particular applied voltages is provided to the ONO layer until the ON layer breaks down. The lifetime is the time at which a certain percentage of the ONO layers break down. In a preferred embodiment, the percentage is fifty percent. This process of applying a voltage until the ONO layer breaks down is repeated for other applied voltages and other temperatures. This procedure is also repeated for other ONO layers having other control oxide layer thicknesses. Thus, step 152 is analogous to step 102 of the method 100 depicted in FIG. 2.

Referring back to FIGS. 3A and 3B, the lifetimes for ONO layers having a single control oxide layer thickness and multiple nitride layer thicknesses are obtained using multiple constant applied voltages at multiple temperatures, via step 154. For a particular temperature, a particular applied voltage and particular ONO layer, the particular applied voltages is provided to the ONO layer until the ON layer breaks down. The lifetime is the time at which a certain percentage of the ONO layers break down. In a preferred embodiment, the percentage is fifty percent. This process of applying a voltage until the ONO layer breaks down is repeated for other applied voltages and other temperatures. This procedure is also repeated for other ONO layers having other nitride layer thicknesses. Thus, step 152 is analogous to step 102 of the method 100 depicted in FIG. 2.

Referring back to FIGS. 3A and 3B, the field acceleration factor is determined for the control oxide layer, via step 156. The field acceleration factor is determined using the formula (1), the lifetimes, and the applied voltages in step 152. The field acceleration factor is the slope of the curve of the lifetime versus the applied voltage. Similarly, the activation energy can be determined using the lifetimes and the temperatures at which the tests were performed in step 152. The activation energy is the slope of the curve of the lifetime versus the temperature.

Figure 4A:
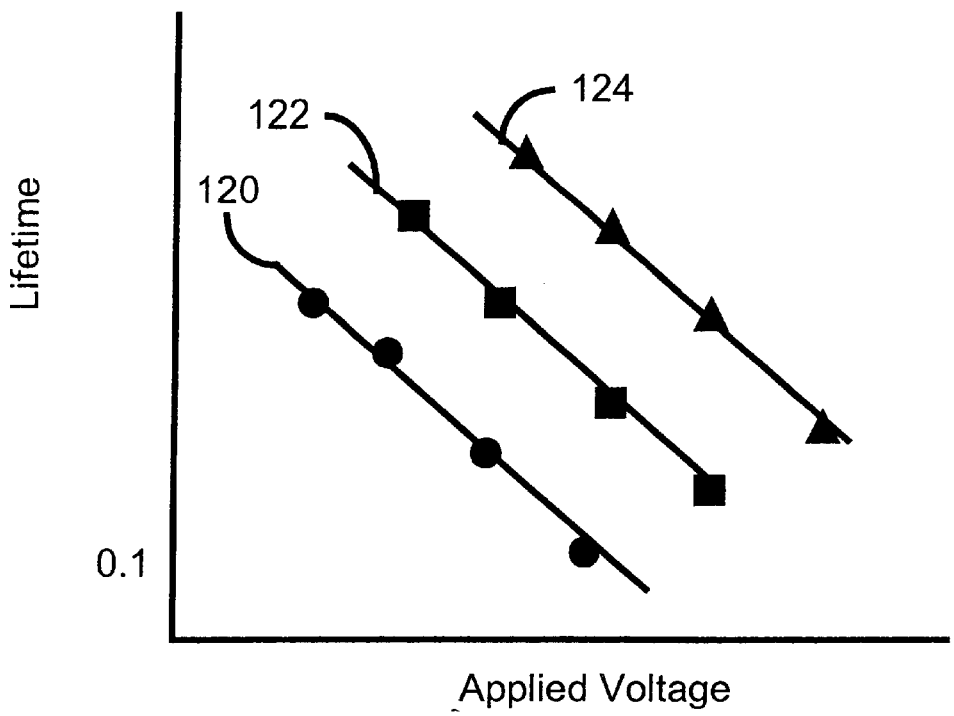
FIG. 4A is a graph depicting lifetime versus the applied voltage for an ONO layer having a particular nitride thickness and a plurality of control oxide thicknesses.
Figure 4B:
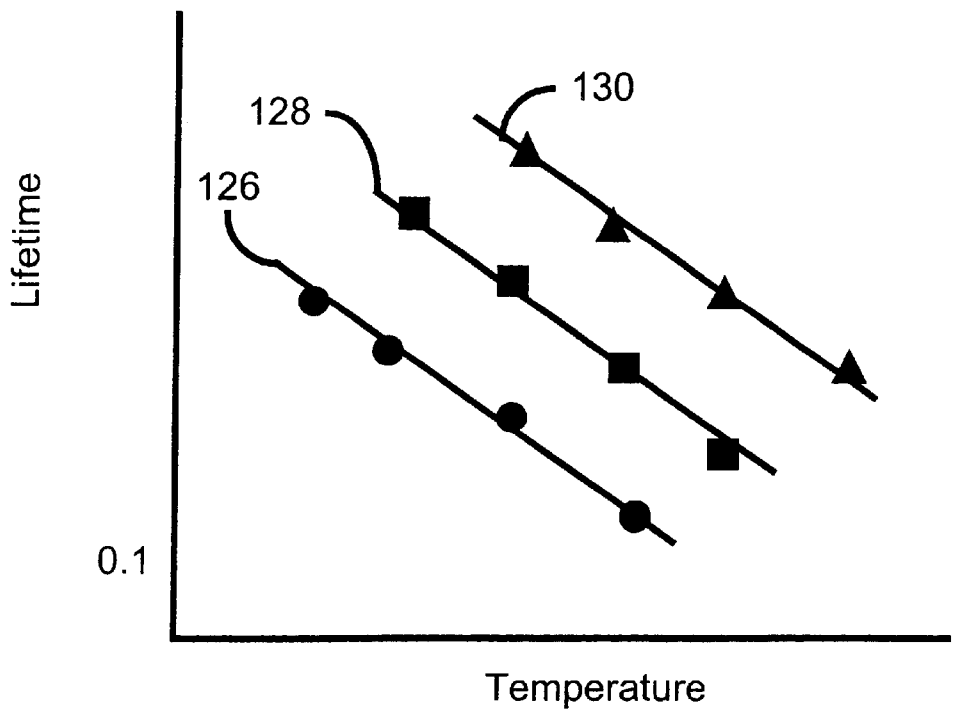
FIG. 4B is a graph depicting lifetime versus the temperature for an ONO layer having a particular nitride thickness and a plurality of control oxide thicknesses.

FIGS. 4A and 4B depict plots of the lifetime versus the applied voltage and the temperature, respectively. FIG. 4A includes plots 120, 122 and 124 for different control oxide thicknesses and different applied voltages. FIG. 4B includes plots 126, 128 and 130 for different control oxide thicknesses and different test temperatures. As can be seen in FIGS. 4A and 4B, the curves 120, 122, 124, 126, 128 and 130 are relatively linear. The slope of the curves 120, 122 and 124 provides the field acceleration factor for the control oxide layer.

The activation energy for the control oxide layer, $E_{acontrol\ ox}$, is determined, via step 158. Step 158 is preferably performed by determining the relationship between the lifetime of the ONO layer and the temperature of the ONO layer and finding the slope of the curve representing this relationship.

FIG. 4B depicts a plot of the lifetime versus the temperature. FIG. 4B includes plots 126, 128 and 130 for different control oxide thicknesses and different test temperatures. As can be seen in FIG. 4B, the curves 126, 128 and 130 are relatively linear. The slope of the curves 126, 128 and 130 provides the activation energy for the control oxide layer.

The field acceleration factor, $B_{nitride}$, for the nitride layer is determined, via step 160. Step 160 is performed in substantially the same way as step 156, except that the voltages and lifetimes are obtained in step 154. The activation energy for the nitride layer, $E_{nitride}$ is determined in step 162. Step 162 is performed in a similar manner to step 158, however, the lifetimes and temperatures from step 154 (varying nitride layer thickness) are used.

The activation energy for the ONO layer, $E_{ONO}$, is then determined using the activation energy for the control oxide layer and the activation energy for the nitride layer, via step 164. The activation energy for the ONO layer can be determined by estimating the activation energy from the samples used in step 152 or 154. This is the simplest method of obtaining the activation energy for the ONO layer. In an alternate embodiment, the activation energy of the ONO layer can be estimated in step 164 using the reciprocals of the activation energies for the control oxide and nitride layers. In such an estimate:

$$1/E_{ONO} = 1/E_{control\ oxide} + 1/E_{nitride} \quad (4)$$

The field acceleration factor for the ONO layer, $B_{ONO}$, is then determined, via step 166. The field acceleration factor for the ONO layer is determined based on the field acceleration factor for the nitride layer and the field acceleration factor for the control oxide layer. The field acceleration factor for the ONO layer can be calculated using the following:

$$1/B_{ONO} = 1/B_{control\ oxide} + 1/B_{nitride} \quad (5)$$

The lifetime for the ONO layer is then determined using equation (2) and the quantities that are known (such as the breakdown voltage) or calculated (such as $B_{ONO}$), via step 168.

The desired thicknesses for the nitride and control oxide layers is then determined, via step 170. Preferably, step 170 includes determining the relationship between the lifetime for the ONO layer and the nitride and control oxide layer thicknesses. This mathematical relationship can be viewed as a surface in three dimensions. Based on this relationship, the optimal control oxide thickness and the optimal nitride layer thickness can be selected. These optimal thicknesses result in a longer ONO lifetime. In a preferred embodiment, the optimal control oxide layer thickness and the optimal nitride layer thickness result in the longest ONO layer lifetime. However, the control oxide layer thickness and the nitride layer thickness selected in step 170 are preferably at or close to the nitride layer and control oxide thicknesses tested in steps 152 and 154. It is desirable for these optimal thicknesses to be at or close to the tested thicknesses because there is some variation in the activation energy and field acceleration factor with thickness.

Figure 5:
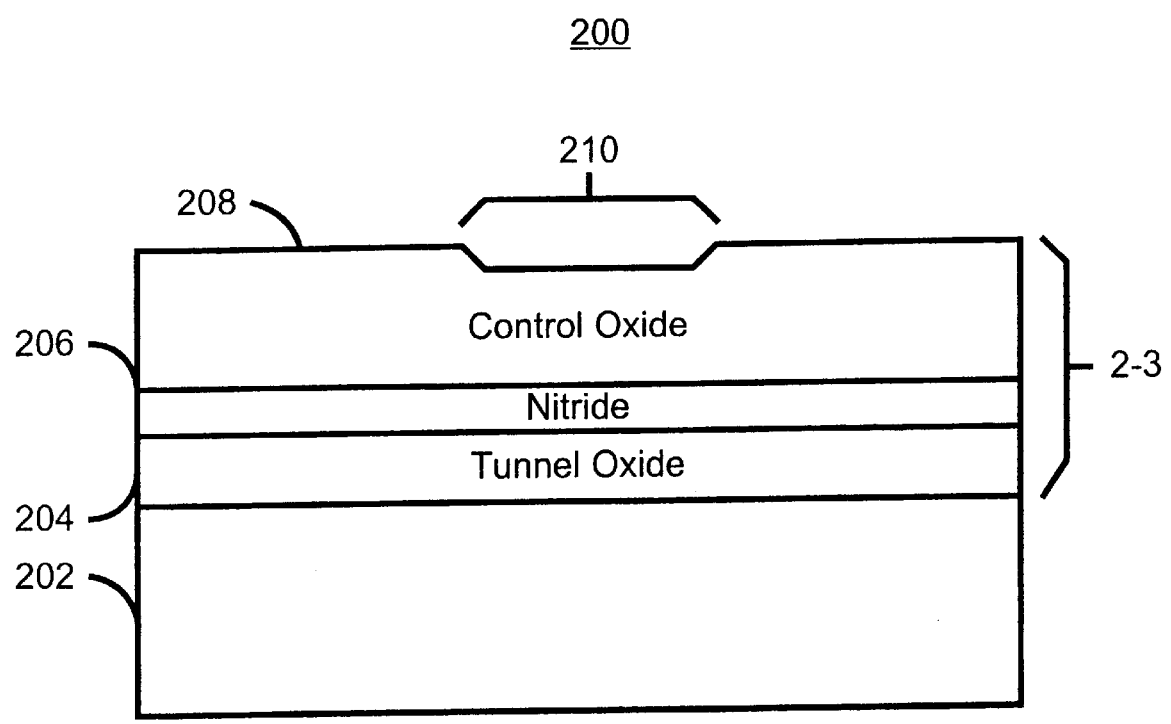
FIG. 5 is a diagram of an ONO layer in accordance with the present invention.

FIG. 5 depicts a portion of a semiconductor device 200 in accordance with the present invention, such as a Flash memory device. The conventional semiconductor 200 utilizes an ONO layer 203 formed on a semiconductor substrate 202. The ONO layer 203 includes two oxide layers 204 and 208 separated by a nitride layer 206. The first oxide layer 204, which is closest to the substrate 202 is a tunnel oxide layer 204. The upper oxide layer is a control oxide layer 208. The thinned portion of the control oxide layer 208 corresponds to a bitline 210 that runs perpendicular to the plane of FIG. 5. The ONO layer 203 is qualified using the method 100 and 150. In addition, in a preferred embodiment, the ONO layer 203 has the thicknesses of the control oxide 208 and the nitride layer 206 set using the method 150. Thus, the thicknesses of the control oxide layer 208 and the nitride layer 206 are optimal.

Thus, the method 100 and 150 can qualify an ONO layer. Furthermore, because the constant applied voltage is used, the methods 100 and 150 more closely approximate actual operating conditions. In addition, the methods 100 and 150 can be used to provide a semiconductor device, such as the semiconductor device 200, in which the nitride and control oxide layers have thicknesses selected to improve the lifetime of the ONO layer.

A method and system has been disclosed for qualifying an ONO layer. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for qualifying an oxide-nitride-oxide (ONO) layer including a first oxide layer, a nitride layer and a control oxide layer in a semiconductor device, the method comprising the steps of:

(a) determining a first plurality of lifetimes for the ONO layer utilizing a first plurality of applied voltages at a first plurality of temperatures for each of a first plurality of ONO layers having a particular nitride layer thickness and a plurality of control oxide layer thicknesses;

(b) determining a second plurality of lifetimes for the ONO layer utilizing a second plurality of applied voltages at a second plurality of temperatures for each of a second plurality of ONO layers having a particular control oxide layer thickness and a plurality of nitride layer thicknesses;

(c) determining a field acceleration factor for the ONO layer based on the first plurality of lifetimes, the second plurality of lifetimes, the first plurality of applied voltages and the second plurality of applied voltages;

(d) determining an activation energy for the ONO layer based on the first plurality of lifetimes, the second plurality of lifetimes, the first plurality of temperatures and the second plurality of temperatures; and (e) determining a lifetime for the ONO layer based upon the field acceleration factor and the activation energy for the ONO layer.

2. The method of claim 1 wherein the field acceleration factor determining step (c) further includes the step of:
  (c1) determining a control oxide field acceleration factor using the first plurality lifetimes and the first plurality of applied voltages;
  (c2) determining a nitride field acceleration factor using the second plurality of lifetimes and the second plurality of applied voltages; and
  (c3) determining the field acceleration factor for the ONO layer based on the control oxide field acceleration factor and the nitride field acceleration factor.

3. The method of claim 1 wherein the activation energy determining step (d) further includes the steps of:
  (d1) determining a control oxide activation energy using the first plurality of lifetimes and the first plurality of temperatures;
  (d2) determining a nitride activation energy using the second plurality of lifetimes and the second plurality of temperatures; and
  (d3) determining the activation energy based on the control oxide activation energy and the nitride activation energy.

4. The method of claim 1 further including the step of:
  (f) determining a relationship between the lifetime of the ONO layer, a nitride layer thickness and a control oxide layer thickness.

5. The method of claim 4 further comprising the step of:
  (g) determining an optimal control oxide layer thickness and an optimal nitride layer thickness based on the relationship between the lifetime of the ONO layer, a nitride layer thickness and a control oxide layer thickness.

6. The method of claim 1 further comprising the step of:
  (f) narrowing the plurality of oxide layers and the plurality of nitride layers tested.

7. The method of claim 6 wherein the narrowing step further includes the steps of:
  (f1) performing a voltage ramp dielectric breakdown test to determine a plurality of breakdown voltages;
  (f2) converting the plurality of breakdown voltages to a plurality of effective thicknesses and a plurality of effective lifetimes; and
  (f3) utilizing a portion of the plurality of thicknesses for the plurality oxide layers and the plurality of nitride layers, the portion of the plurality of thicknesses having higher effective lifetimes.

* * * * *

UNITED STATES PATENT AND TRADEMARK OFFICE
CERTIFICATE OF CORRECTION

PATENT NO.    : 6,509,202 B1
DATED         : January 21, 2003
INVENTOR(S)   : Hyeon-Seag Kim It is certified that error appears in the above-identified patent and that said Letters Patent is hereby corrected as shown below:

<u>Column 5,</u>
Line 4, please replace "χnitride" with -- $\chi_{nitride}$ --.

<u>Column 6,</u>
Line 5, please insert a new line break following "thickness".

Signed and Sealed this

Thirtieth Day of September, 2003

JAMES E. ROGAN
*Director of the United States Patent and Trademark Office*